(12) United States Patent
Lou et al.

(10) Patent No.: US 11,737,304 B2
(45) Date of Patent: Aug. 22, 2023

(54) DISPLAY SUBSTRATES, DISPLAY PANELS AND DISPLAY DEVICES

(71) Applicant: KunShan Go-Visionox Opto-Electronics Co., Ltd., Kunshan (CN)

(72) Inventors: Junhui Lou, Kunshan (CN); Yu Jin, Kunshan (CN)

(73) Assignee: KunShan Go- Visionox Opto-Electronics Co., Ltd., Kunshan (CN)

( * ) Notice: Subject to any disclaimer, the term of this patent is extended or adjusted under 35 U.S.C. 154(b) by 190 days.

(21) Appl. No.: 17/501,428

(22) Filed: Oct. 14, 2021

(65) Prior Publication Data
US 2022/0037612 A1 Feb. 3, 2022

Related U.S. Application Data

(63) Continuation of application No. PCT/CN2020/093762, filed on Jun. 1, 2020.

(30) Foreign Application Priority Data

Sep. 27, 2019 (CN) .......................... 201921635063.9

(51) Int. Cl.
 *H10K 59/60* (2023.01)
 *H10K 59/65* (2023.01)
 *H10K 50/816* (2023.01)

(52) U.S. Cl.
CPC ........... *H10K 50/816* (2023.02); *H10K 59/60* (2023.02); *H10K 59/65* (2023.02)

(58) Field of Classification Search
CPC . H10K 50/818; H10K 59/65; H10K 59/80518
See application file for complete search history.

(56) References Cited

U.S. PATENT DOCUMENTS 9,923,170 B2   3/2018   Kim et al.
10,658,443 B2  5/2020   Beak et al.
(Continued)

FOREIGN PATENT DOCUMENTS

CN   105609525 A   5/2016
CN   106783732 A   5/2017
(Continued)

OTHER PUBLICATIONS

International Search Report dated Aug. 27, 2020 in corresponding International application No. PCT/CN2020/093762; 4 pages.
(Continued)

*Primary Examiner* — Daniel P Shook
(74) *Attorney, Agent, or Firm* — Maier & Maier, PLLC

(57) ABSTRACT

An array substrate, a display panel and a display device are provided. The display substrate includes: a substrate, a planarization layer, a middle layer and a first electrode layer. The substrate includes a first area and a second area. The planarization layer is located on the substrate and covers the first area and the second area. The middle layer is located on the planarization layer and includes at least one transparent conductive sub-layer and at least one isolation protective sub-layer. A projection of the transparent conductive sub-layer on the substrate is located in the first area, and a projection of the isolation protective sub-layer on the substrate is located in the second area. The first electrode layer is located on the middle layer and includes at least one first electrode located on the transparent conductive sub-layer and at least one second electrode located on the isolation protective sub-layer.

18 Claims, 2 Drawing Sheets

(56) References Cited

U.S. PATENT DOCUMENTS

2016/0133874 A1    5/2016   Kim et al.
2018/0053788 A1*   2/2018   Lee ..................... H01L 27/124
2018/0122877 A1    5/2018   Beak et al.

FOREIGN PATENT DOCUMENTS

CN    108022948  A    5/2018
CN    108364957  A    8/2018
CN    210245502  U    4/2020

OTHER PUBLICATIONS

Nritten Opinion of the International Searching Authority dated Aug. 27, 2020 in corresponding International application No. PCT/CN2020/093762; 6 pages.

* cited by examiner

DISPLAY SUBSTRATES, DISPLAY PANELS AND DISPLAY DEVICES

CROSS REFERENCE TO RELATED APPLICATIONS

The present application is a continuation application of International Application No. PCT/CN2020/093762, filed on Jun. 1, 2020, which claims priority to Chinese Patent Application No. 201921635063.9, filed on Sep. 27, 2019, both of which are incorporated herein by reference in their entireties.

TECHNICAL FIELD

The present disclosure relates to a field of OLED display technology, and in particular, to display substrates, display panels, and display devices.

BACKGROUND

With rapid development of display devices, users have increasingly higher requirements on screen-to-body ratio. Because the top of the screen needs to install components such as cameras, sensors and earphones, a part area on the top of the screen is usually reserved for the installation of the above components, for example, the "notch" area of the iPhone X, which affects the overall consistency of the screen. At present, the full-screen display is receiving more and more attention from the industry.

SUMMARY

A display substrate, a display panel, and a display device are provided to overcome the above shortcomings.

According to a first aspect of the embodiments of the present disclosure, there is provided a display substrate, including: a substrate, including a first area and a second area; a planarization layer located on the substrate and covering the first area and the second area; a middle layer located on the planarization layer, and wherein the middle layer includes at least one transparent conductive sub-layer and at least one isolation protective sub-layer, wherein a projection of the at least one transparent conductive sub-layer on the substrate is located in the first area, a projection of the at least one isolation protective sub-layer on the substrate is located in the second area; and a first electrode layer located on the middle layer, and wherein the first electrode layer includes at least one first electrode and at least one second electrode, wherein the at least one first electrode is located on the at least one transparent conductive sub-layer, and the at least one second electrode is located on the at least one isolation protective sub-layer.

According to a second aspect of the embodiments of the present disclosure, there is provided a display panel including the above-mentioned display substrate and an encapsulation layer located on the display substrate; wherein the display panel includes a first display area and a second display area, a light transmittance of the first display area is greater than a light transmittance of the second display area; a projection of the first display area on the substrate is located in the first area, and a projection of the second display area on the substrate is located in the second area.

According to a third aspect of the embodiments of the present disclosure, there is provided a display device, including: a device body having a component area; and the above-mentioned display panel, wherein the display panel covers the device body; and the component area is located below the first display area, and the component area includes at least one photosensitive component which is emitting or collecting light passing through the first display area.

According to the above-mentioned embodiments, since the middle layer on the planarization layer includes the isolation protective sub-layer, and the second electrode is located on the isolation protective sub-layer, during the manufacturing process, even if the planarization layer under the second electrode is damaged, since the second electrode and the planarization layer are separated by the middle layer, the second electrode may be prevented from being affected by damage to the planarization layer underneath, and display abnormalities may be reduced, yield may be improved.

The above general descriptions and the following detailed descriptions are only exemplary and explanatory, and cannot limit the present disclosure.

DETAILED DESCRIPTION OF THE EMBODIMENTS

Figure 1:
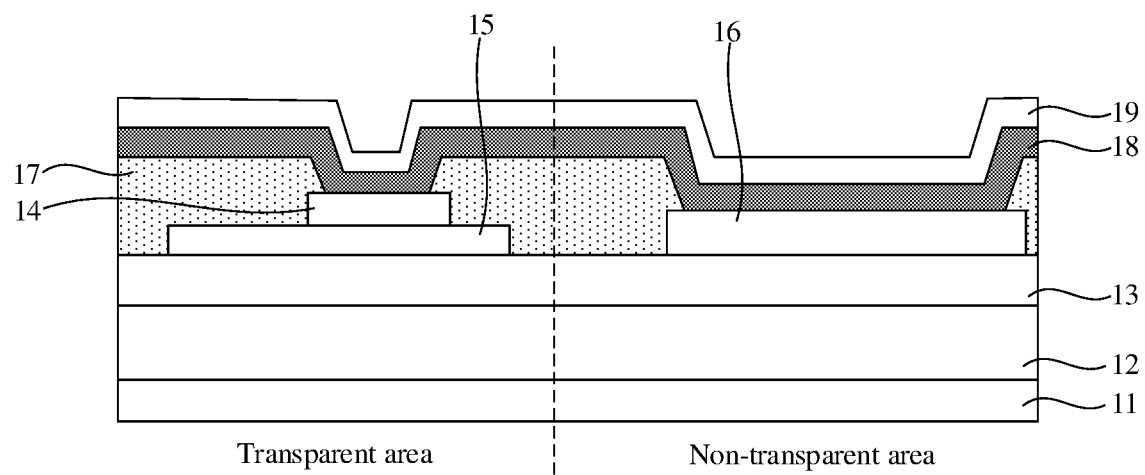
FIG. 1 is a schematic structural diagram illustrating a full-screen.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

FIG. 1 shows a full screen, which includes a non-transparent display area and a transparent display area. The transparent display area may achieve both light transmitting and display functions. Photosensitive elements such as one or more cameras and one or more distance sensors are arranged under the transparent display area. The full screen includes a substrate 11, a driving circuit layer 12 and a planarization layer 13. In the transparent display area, there are a plurality of first opaque anodes 14 arranged in an array on the planarization layer 13. The first opaque anode 14 may be connected with a corresponding pixel circuit through a transparent lead 15 under the first opaque anode 14, or connected with other first opaque anodes 14. In the non-transparent display area, there are a plurality of second opaque anodes 16 arranged in an array on the planarization layer 13. As shown in FIG. 1, the full screen further includes a pixel definition layer 17, an organic light-emitting layer 18 and a cathode 19. The first opaque anode 14 may include indium tin oxide (ITO), silver (Ag), and indium tin oxide which are stacked in sequence, and the second opaque anode 16 may include indium tin oxide, silver, and indium tin oxide which are stacked in sequence.

In a process of manufacturing the above-mentioned full screen, the transparent lead 15 is usually prepared before the first opaque anode 14 and the second opaque anode 16 are prepared. In this way, a portion of the planarization layer 13 located in the non-transparent display area undergoes two film formations and two etchings. Since a material of the planarization layer 13 is an organic material whose stability is relatively poor, after undergoing two film formations and two etchings, the portion of the planarization layer 13 located in the non-transparent display area is easily damaged, which causes the second opaque anode 16 in the non-transparent display area to be unstable, resulting in a migration of silver, and thus display abnormality.

In view of the above technical problems, embodiments of the present disclosure provide a display substrate, a display panel, and a display device, which may avoid display abnormality caused by damage to the planarization layer and improve yield.

Figure 2:
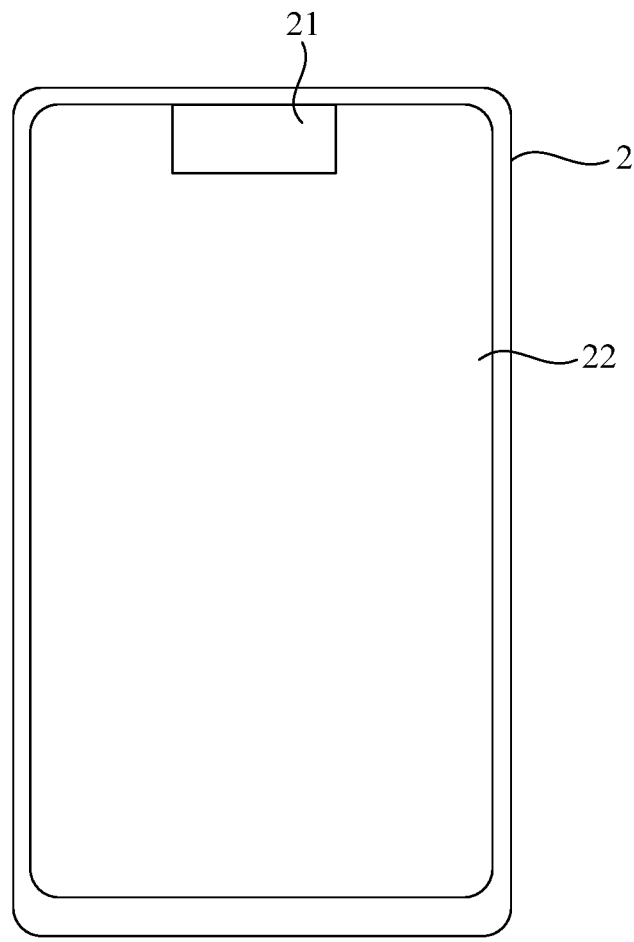
FIG. 2 is a schematic structural diagram illustrating a display panel according to examples of the present disclosure.

A display panel is provided according to examples of the present disclosure. As shown in FIG. 2, the display panel 2 includes a first display area 21 and a second display area 22. A light transmittance of the first display area 21 is greater than a light transmittance of the second display area 22.

Figure 3:
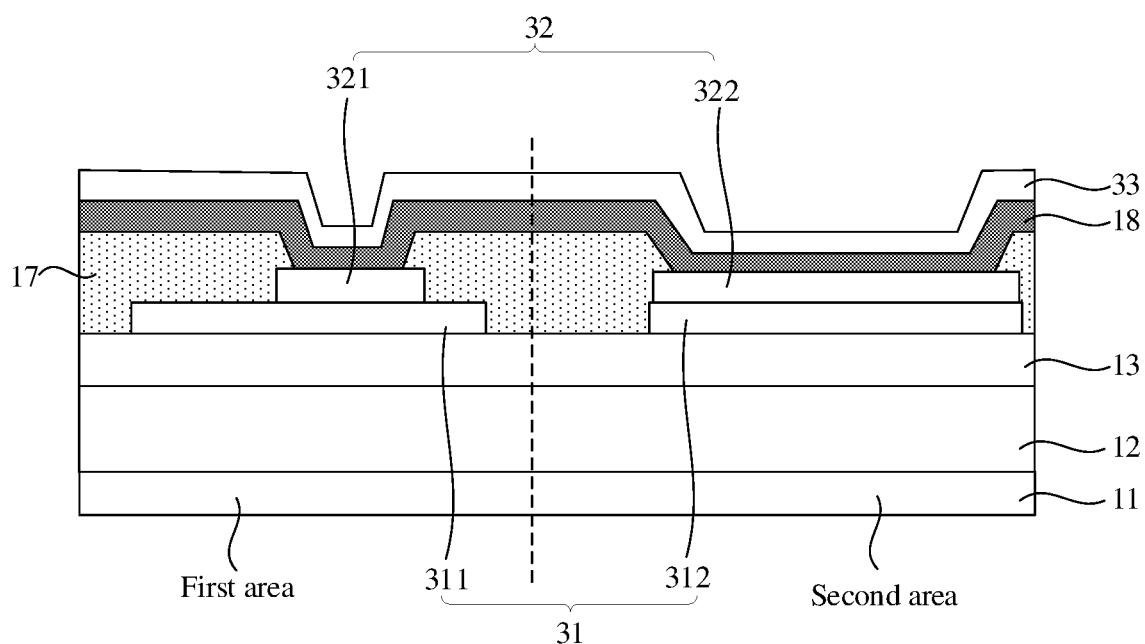
FIG. 3 is a schematic structural diagram illustrating a display substrate according to examples of the present disclosure.

The display panel 2 includes a display substrate and an encapsulation layer, and the encapsulation layer is located on the display substrate. As shown in FIG. 3, the display substrate includes a substrate 11, a planarization layer 13, a middle layer 31 and a first electrode layer 32.

As shown in FIG. 3, the substrate 11 includes a first area and a second area. A projection of the first display area 21 on the substrate 11 is located in the first area, and a projection of the second display area 22 on the substrate 11 is located in the second area.

As shown in FIG. 3, the planarization layer 13 is located on the substrate 11 and covers the first area and the second area. The middle layer 31 is located on the planarization layer 13, and the first electrode layer 32 is located on the middle layer 31. The middle layer 31 includes at least one transparent conductive sub-layer 311 and at least one isolation protective sub-layer 312. A projection of each of the at least one transparent conductive sub-layer 311 on the substrate 11 is located in the first area, and a projection of each of the at least one isolation protective sub-layer 312 on the substrate is located in the second area. The first electrode layer 32 includes at least one first electrode 321 and at least one second electrode 322, the at least one first electrode 321 is located on the at least one transparent conductive sub-layer 311, and the at least one second electrode 322 is located on the at least one isolation protective sub-layer 312.

In the present embodiment, since the middle layer located on the planarization layer includes the at least one isolation protective sub-layer, and the at least one second electrode is located on the at least one isolation protective sub-layer, during the manufacturing process, even if the planarization layer under the second electrode is damaged, since the second electrode and the planarization layer are separated by the middle layer, the second electrode may be prevented from being affected by damage to the planarization layer underneath, and display abnormality may be reduced, yield may be improved.

In an example, the first display area 21 may include a plurality of first pixels arranged in an array, and the second display area 22 may include a plurality of second pixels arranged in an array. The middle layer 31 may include a plurality of transparent conductive sub-layers 311 arranged in an array and a plurality of isolation protective sub-layers 312 arranged in an array. The plurality of transparent conductive sub-layers 311 are located in the first display area 21, and the plurality of isolation protective sub-layers 312 are located in the second display area 22. The first electrode layer 32 may include a plurality of first electrodes 321 arranged in an array and a plurality of second electrodes 322 arranged in an array. One first pixel includes one first electrode 321, and the first electrode 321 is an anode of the first pixel. One second pixel includes one second electrode 322, and the second electrode 322 is an anode of the second pixel. That is, the first display area 21 includes a plurality of first electrodes 321 arranged in an array, and the second display area 22 includes a plurality of second electrodes 322 arranged in an array. One first electrode 321 is located on one transparent conductive sub-layer 311, and one second electrode 322 is located on one isolation protective sub-layer 312.

In an embodiment, a surface of the at least one first electrode 321 facing away from the substrate 11 is flush with a surface of the at least one second electrode 322 facing away from the substrate 11.

In an embodiment, an area of the at least one first electrode 321 is smaller than an area of the at least one second electrode 322, and a density of the first pixels in the first display area 21 is less than or equal to a density of the second pixels in the second display area 22. A distance between two adjacent first electrodes 321 is greater than a distance between two adjacent second electrodes 322. Since the area of each of the at least one first electrode 321 is relatively small, and the distance between two adjacent first electrodes is greater than the distance between two adjacent second electrodes, the light transmittance of the first display area may be improved. Since the area of each of the at least one second electrode 322 is relatively large, an aperture ratio of the second pixel may be increased.

The material of the at least one transparent conductive sub-layer 311 is the same as the material of the at least one isolation protective sub-layer 312, that is, the material of the at least one isolation protective sub-layer 312 is a transparent conductive material, and the at least one isolation protective sub-layer 312 may also be conductive. In this embodiment, the at least one transparent conductive sub-layer 311 and the at least one isolation protective sub-layer 312 may be formed in the same process step. Since the material of the transparent conductive sub-layer is the same as the material of the isolation protective sub-layer, and the transparent conductive sub-layer and the isolation protective sub-layer are formed in the same process step, the manufacturing process may be simplified and the cost may be reduced.

For example, the material of the at least one transparent conductive sub-layer 311 is indium tin oxide (ITO), and the material of the at least one isolation protective sub-layer 312 is also indium tin oxide (ITO). In some embodiments, the material of the at least one transparent conductive sub-layer may be graphene, indium zinc oxide or indium tin zinc oxide. Correspondingly, the material of the at least one isolation protective sub-layer may also be graphene, indium zinc oxide or indium tin zinc oxide.

Optionally, the first electrode 321 is an opaque electrode, the second electrode 322 is an opaque electrode. Since the first electrode 321 is an opaque electrode, light emitted from a light-emitting structure on the first electrode 321 toward the first electrode 321 may be reflected to the light-exiting surface of the light-emitting structure, thereby improving the light extraction efficiency of the light-emitting structure in the first display area. Since the second electrode is an opaque electrode, light emitted from a light-emitting structure on the second electrode toward the second electrode may be reflected to the light-exiting surface of the light-emitting structure, thereby improving the light extraction efficiency of the light-emitting structure in the second display area.

Optionally, each of the at least one first electrode 321 includes a first transparent conductive layer, a first metal layer, and a second transparent conductive layer which are stacked in sequence. The first transparent conductive layer is located on the middle layer 31. Each of the at least one second electrode 322 includes a third transparent conductive layer, a second metal layer, and a fourth transparent conductive layer which are stacked in sequence. The third transparent conductive layer is located on the middle layer 31. Alternatively, each of the at least one second electrode 322 includes a second metal layer and a third transparent conductive layer which are stacked in sequence, the second metal layer is located on the middle layer 31. Since the isolation protective sub-layer may be conductive, each of the at least one second electrode may be a structure of the third transparent conductive layer, the second metal layer, and the fourth transparent conductive layer which are stacked in sequence, or a structure of the second metal layer and the third transparent conductive layer which are stacked in sequence.

A material of the first transparent conductive layer, a material of the second transparent conductive layer, a material of the third transparent conductive layer, and a material of the fourth transparent conductive layer may be ITO, but are not limited thereto. A material of the first metal layer and a material of the second metal layer may be silver, but are not limited thereto.

The display substrate further includes at least one first pixel circuit. Each of the at least one first electrode 321 is connected with each of the at least one first pixel circuit through a corresponding transparent conductive sub-layer 311. In this way, the first electrode 321 may be connected with the first pixel circuit through the transparent conductive sub-layer.

A projection of the at least one first pixel circuit on the substrate 11 is located in the first area. That is, the at least one first pixel circuit is located in the first display area. In another embodiment, the projection of the at least one first pixel circuit on the substrate 11 is located in the second area, that is, the at least one first pixel circuit is located in the second display area. Since the pixel circuits corresponding to the pixels in the first display area is located in the second display area, the light transmittance of the first display area may be improved.

As shown in FIG. 3, the display substrate further includes an organic light-emitting layer 18. The organic light-emitting layer 18 is located on the first electrode layer 32. In this embodiment, each first electrode 321 includes m electrode blocks, and m is a natural number. For example, m may be 1, 2, 3, or other natural numbers. The organic light-emitting layer 18 includes a plurality of light-emitting structures emitting light of n colors, and n is a natural number. For example, n is 3, and the organic light-emitting layer 18 includes one or more light-emitting structures emitting light of a red color, one or more light-emitting structures emitting light of a green color, and one or more light-emitting structures emitting light of a blue color, but it is not limited thereto. In other embodiments, n may be 1, 2, or other natural numbers. In this embodiment, one light-emitting structure is provided on each electrode block, and the at least one light-emitting structure disposed on one first electrode emitting light of a same color. For example, when one first electrode 321 includes four electrode blocks, the light-emitting structures on the four electrode blocks have the same light-emitting color. In this embodiment, the middle layer includes a plurality of transparent conductive sub-layers 311, and all electrode blocks of one first electrode 321 are located on one transparent conductive sub-layer. All the electrode blocks in the same first electrode may be electrically connected through the same transparent conductive sub-layer, so that the light-emitting structures on all the electrode blocks in the same first electrode may emit light at the same time.

One light-emitting structure is provided on each second electrode 322. A contact area between one light-emitting structure on the second electrode 322 and the second electrode 322 is a pixel display area. A first projection of the pixel display area on the planarization layer 13 is located in a second projection of a corresponding isolation protective sub-layer 312 on the planarization layer 13, and an edge of the first projection does not coincide with an edge of the second projection. Since the edge of the first projection and the edge of the second projection do not coincide, this arrangement may prevent the edge of the isolation protective sub-layer from affecting a flatness of the second electrode, thereby avoiding affecting the display quality.

Optionally, an area of each of the at least one isolation protective sub-layer 312 is substantially the same as an area of a corresponding second electrode 322. In one embodiment, the area of the isolation protective sub-layer 312 is the same as the area of the second electrode 322. Alternatively, a difference between the area of the isolation protective sub-layer 312 and the area of the second electrode 322 is within a specified range.

As shown in FIG. 3, the above-mentioned display substrate further includes a second electrode layer 33. The second electrode layer 33 is located on an organic light-emitting layer 18. The second electrode layer 33 may include a surface electrode located in the first display area 21 and the second display area 22. The surface electrode is a cathode of the first pixels and the second pixels.

As shown in FIG. 3, the above-mentioned display substrate further includes a driving circuit layer 12. The driving circuit layer 12 is located between the substrate 11 and the planarization layer 13. A material of a portion of the driving circuit layer 12 located in the first display area 21 may be a material with a higher light transmittance, so as to increase the light transmittance of the first display area 21.

As shown in FIG. 3, the above-mentioned display substrate further includes a pixel definition layer 17. The pixel definition layer 17 is located on the planarization layer 13 and is configured to isolate two adjacent pixels. A material of the pixel definition layer 17 may be an organic material. For example, the material of the pixel definition layer 17 may be polymethyl methacrylate or epoxy resin.

The present disclosure further provides a display substrate which is included in the display panel as described above. The display substrate includes: a substrate, a planarization layer, a middle layer and a first electrode layer.

The substrate includes a first area and a second area; the planarization layer 13 is located on the substrate 11 and covers the first area and the second area. The middle layer is located on the planarization layer. The middle layer includes at least one transparent conductive sub-layer and at least one isolation protective sub-layer. A projection of the at least one transparent conductive sub-layer on the substrate is located in the first area, and a projection of the at least one isolation protective sub-layer on the substrate is located in the second area. The first electrode layer is located on the middle layer. The first electrode layer includes at least one first electrode and at least one second electrode. The at least one first electrode is located on the at least one transparent conductive sub-layer, and the at least one second electrode is located on the at least one isolation protective sub-layer.

In this embodiment, the middle layer located on the planarization layer includes the at least one isolation protective sub-layer, and the at least one second electrode is located on the at least one isolation protective sub-layers. During the manufacturing process, even if the planarization layer under the second electrode is damaged, since the second electrode and the planarization layer are separated by the middle layer, the second electrode may be prevented from being affected by damage to the planarization layer underneath, which may reduce display abnormality and increase yield.

The present disclosure further provides a display device including a device body and a display panel in any one of above-described embodiments.

The display panel covers the device body, and the device body has a component area. The component area is located below a first display area, and the component area includes at least one photosensitive component which is emitting or collecting light passing through the first display area. The at least one photosensitive component includes at least one of: a camera, a light sensor and a light emitter.

In this embodiment, a middle layer located on a planarization layer includes at least one isolation protective sub-layer, and at least one second electrode is located on the at least one isolation protective sub-layer. During the manufacturing process, even if the planarization layer under the at least one second electrode is damaged, since the at least one second electrode and the planarization layer are separated by the middle layer, the at least one second electrode may be prevented from being affected by damage to the planarization layer underneath, which may reduce display abnormality and increase yield.

It should be noted that the display device in the present disclosure may be an electronic paper, a mobile phone, a tablet computer, a TV, a notebook computer, a digital photo frame, a navigator and other products or components with a display function.

After considering the specification and practicing the disclosure disclosed herein, those skilled in the art will easily come up with other embodiments of the present disclosure. This disclosure is intended to cover any variations, uses, or adaptive changes of the present disclosure. These variations, uses, or adaptive changes follow the general principles of the present disclosure and include common knowledge or customary technical means in the technical field that are not disclosed in the present disclosure. The description and the embodiments are only regarded as exemplary, and the true scope and spirit of the disclosure are pointed out by the following claims.

The invention claimed is:
1. A display substrate, comprising:
a substrate comprising a first area and a second area;
a planarization layer located on the substrate and covering the first area and the second area;
a middle layer located on the planarization layer, and wherein the middle layer comprises:
   at least one transparent conductive sub-layer, wherein a projection of the at least one transparent conductive sub-layer on the substrate is located in the first area; and
   at least one isolation protective sub-layer, wherein a projection of the at least one isolation protective sub-layer on the substrate is located in the second area; and a first electrode layer located on the middle layer, and wherein the first electrode layer comprises:
   at least one first electrode located on the at least one transparent conductive sub-layer, and
   at least one second electrode located on the at least one isolation protective sub-layer.

2. The display substrate according to claim 1, wherein the at least one first electrode comprises a plurality of first electrodes arranged in an array, and the at least one second electrode comprises a plurality of second electrodes arranged in an array.

3. The display substrate according to claim 2, wherein an area of each of the first electrodes is smaller than an area of each of the second electrodes.

4. The display substrate according to claim 2, wherein a distance between two adjacent first electrodes is greater than a distance between two adjacent second electrodes.

5. The display substrate according to claim 2, wherein the plurality of first electrodes are opaque electrodes, and the plurality of second electrodes are opaque electrodes.

6. The display substrate according to claim 2, further comprising an organic light-emitting layer located on the first electrode layer;
wherein each of the first electrodes comprises m electrode blocks, m is a natural number;
the organic light-emitting layer comprises a plurality of light-emitting structures emitting light of n colors, at least one light-emitting structure is provided on each of the electrode blocks, the at least one light-emitting structure disposed on one first electrode emitting light of a same color, n is a natural number; and
the at least one transparent conductive sub-layer comprises a plurality of transparent conductive sub-layers, and the electrode blocks of one first electrode are located on one transparent conductive sub-layer.

7. The display substrate according to claim 2, wherein one light-emitting structure is provided on each of the second electrodes, a contact area between one light-emitting structure and a corresponding second electrode is a pixel display area, a first projection of the pixel display area on the planarization layer is located in a second projection of a corresponding isolation protective sub-layer on the planarization layer, and an edge of the first projection and an edge of the second projection do not coincide.

8. The display substrate according to claim 7, wherein an area of each of the at least one isolation protective sub-layer is substantially the same as an area of a corresponding second electrode.

9. The display substrate according to claim 1, wherein a material of the at least one transparent conductive sub-layer is the same as a material of the at least one isolation protective sub-layer.

10. The display substrate according to claim 1, wherein each of the at least one first electrode comprises a first transparent conductive layer, a first metal layer, and a second transparent conductive layer which are stacked in sequence, and the first transparent conductive layer is located on the middle layer.

11. The display substrate according to claim 1, wherein each of the at least one second electrode comprises a third transparent conductive layer, a second metal layer, and a fourth transparent conductive layer which are stacked in sequence, and the third transparent conductive layer is located on the middle layer.

12. The display substrate according to claim 1, wherein each of the at least one second electrode comprises a second metal layer and a third transparent conductive layer which are stacked in sequence, and the second metal layer is located on the middle layer.

13. The display substrate according to claim 1, wherein a surface of the at least one first electrode facing away from the substrate is flush with a surface of the at least one second electrode facing away from the substrate.

14. The display substrate according to claim 1, further comprising at least one first pixel circuit, wherein each of the at least one first electrode is connected with each of the at least one first pixel circuit through a corresponding transparent conductive sub-layer.

15. The display substrate according to claim 14, wherein a projection of the at least one first pixel circuit on the substrate is located in the first area or the second area.

16. A display panel, comprising:
a display substrate of claim 1,
an encapsulation layer located on the display substrate;
wherein the display panel comprises a first display area and a second display area, and a light transmittance of the first display area is greater than a light transmittance of the second display area; and
a projection of the first display area on the substrate is located in the first area, and a projection of the second display area on the substrate is located in the second area.

17. A display device, comprising:
a device body comprising a component area; and
a display panel according to claim 16, wherein the display panel covers the device body;
wherein the component area is located below the first display area, and the component area comprises at least one photosensitive component which is emitting or collecting light passing through the first display area.

18. The display device according to claim 17, wherein, the at least one photosensitive component comprises at least one of a camera, a light sensor and a light emitter.

* * * * *